United States Patent [19]

Matsumoto

[11] Patent Number: 4,853,621

[45] Date of Patent: Aug. 1, 1989

[54] WATER RESISTANCE LOAD SYSTEM

[75] Inventor: Kesafumi Matsumoto, Atsugi, Japan

[73] Assignee: Kouken Co., Ltd., Atsugi, Japan

[21] Appl. No.: 51,092

[22] Filed: May 18, 1987

[30] Foreign Application Priority Data

| | | | |
|---|---|---|---|
| Mar. 5, 1987 | [JP] | Japan | 62-48875 |
| Mar. 13, 1987 | [JP] | Japan | 62-56827 |
| Mar. 23, 1987 | [JP] | Japan | 62-65801 |
| Apr. 10, 1987 | [JP] | Japan | 62-86759 |

[51] Int. Cl.⁴ .................... G01R 31/00; H01C 10/02; G05F 3/00

[52] U.S. Cl. .................... 324/158 R; 323/296; 338/56; 338/82

[58] Field of Search .................... 324/76, 126, 158 R, 324/74; 338/53, 55, 56, 80, 82, 222; 219/290; 323/296, 298, 364

[56] References Cited

U.S. PATENT DOCUMENTS

| | | | |
|---|---|---|---|
| 1,217,514 | 2/1917 | Simmon | 338/56 |
| 1,277,495 | 9/1918 | Simmon | 338/56 |
| 1,321,483 | 11/1919 | Simmon | 338/56 |
| 2,814,706 | 11/1957 | Lloyd | 338/56 |
| 2,868,932 | 1/1959 | Schonhoff et al. | 338/56 |

FOREIGN PATENT DOCUMENTS

| | | | |
|---|---|---|---|
| 101381 | 10/1936 | Australia | 338/82 |
| 52-26461 | 2/1977 | Japan . | |
| 53-88151 | 3/1978 | Japan . | |
| 53-133754 | 11/1978 | Japan . | |
| 54-21148 | 2/1979 | Japan . | |
| 57-83189 | 5/1982 | Japan . | |
| 57-114205 | 7/1982 | Japan . | |
| 60-232491 | 11/1985 | Japan . | |
| 62-29427 | 2/1987 | Japan . | |
| 18623 | of 1908 | United Kingdom | 338/82 |

*Primary Examiner*—Ernest F. Karlsen
*Attorney, Agent, or Firm*—Jordan and Hamburg

[57] ABSTRACT

The water resistance load system comprises a water resistor, which includes a cylindrical base electrode with a bottom for storing a predetermined quantity of water while water is circulated through the cylindrical base electrode and a cylindrical main electrode penetrating in an insulated state through the center of the bottom and extending into the base electrode, and an electrode water cooling unit, which includes a radiator through which warm water drained from the water resistor is passed to the water resistor, and a water spray tube, a fan and an air guide for spraying water to the radiator, air cooling the surface of the radiator by the latent heat of evaporation of the sprayed water, and guiding generated steam to be discharged into a space.

20 Claims, 9 Drawing Sheets

WATER RESISTANCE LOAD SYSTEM

BACKGROUND OF THE INVENTION

1. FIELD OF THE INVENTION

This invention relates to a water resistance load system used for measurement or testing of output characteristics of generators and various other electric power source devices including inverters.

2. DESCRIPTION OF THE PRIOR ART

The water resistor has heretofore been used as a load system of the type noted. FIG. 1 shows a water resistor α. It comprises three electrode plates (or electrode cylinders) b, to which three-phase high pressure cables a are connected. The electrode plates b are suspended from a support d provided on a water trough c about 3 m in each side and 2 m in height. The extent of immersion of the electrode plates in the water is controlled to control the load, and the output power of the power source device is consumed with water in the water trough c as a resistor. As power is consumed, the water temperature is gradually increased to increase the electric conductivity of the water. This means that dielectric breakdown of the water will eventually occur to generate a dangerous electric arc. To prevent this, it is indispensable to hold the temperature of the water in the water trough c within a predetermined temperature by supplying at all times cold water to the water trough c, as shown by an arrow in FIG. 1, from a river, a fireplug, a water storage pool, etc. while draining elevated-temperature water. This means that a great quantity of water is required when using the water resistor α.

By way of example, a case is considered where water at 20° C. is supplied while warm water at 70° C. is drained. Assuming the heat dissipation to be $(70-20)\times 1=50$ *kcal/l,* i.e., that 50 kcal of heat is dissipated per 1l of water, 1,000 kW, for instance, of the output of a power source device corresponds to $1{,}000\times 860=860{,}000$ *kcal/h.* When this value is divided by heat dissipated per 1 $m^3$ of water (i.e., $50\times 1{,}000=50{,}000$ *kcal*), it will be seen that 17.2 $m^3$ per hour of water is necessary. When the water resistor is used for 8 hours, $17.2\times 8\approx 140$ $m^3$ of water is necessary.

It is difficult to secure this amount of water. Besides, the water resistor α requires when using it the water trough c, a support for suspending it and a pump and piping for supplying water from the water storage pool. The overall equipment, therefore, is rather elaborate, requiring a great deal of labor for its transportation and assembly.

Further, the electric conductivity of water varies with the impurity concentration, and this means that it is difficult to obtain a stable value of resistance with the water resistor α.

A further grave disadvantage of the water resistor α is that the use thereof leads to the production of a great quantity of warm drain water. When load testing of a 1,000-kW power source device is done in an urban area under the conditions noted above, draining warm water at 70° C. at a rate of 17.2 $m^3$/h., for instance, overflow of the drained water is liable to occur depending on the draining capacity. Even if the drained water will now overflow, it will exterminate bacteria, thus reducing the drainage purifying function. In some cases, therefore, the load testing is prohibited by the drainage supervisor.

As shown above, the water resistor as a load system used for the measurement of characteristics of a power source device has the problems that generation of an electric arc is possible when it is used under a high voltage condition, that a large quantity of water is required, that elaborate equipment and labor are required, that the resistance provided is instable and that a great quantity of warm water is drained.

Further, the input power to the electrode section varies due to various causes. Although it may be held constant with suitable means by monitoring it at all time, from the standpoint of energy saving a device for automatically holding the input constant is necessary.

Further, where the main electrode section is used under a high voltage condition, the closer to the main electrode section the higher the interelectrode current density is, and the greater heat is generated. If the surface temperature of the high voltage main electrode section is quickly increased to generate air bubbles, an arc discharge is liable to result. In the event if an arc discharge is produced, it is liable to lead to a large accident. Therefore, it is necessary to provide safety measures.

SUMMARY OF THE INVENTION

An object of the invention is to provide a water resistance load system, which is less subject to electric arc generation although water is used, does not produce warm drain water, permits extreme reduction of the quantity of water used and permits a stable resistance to be obtained.

Another object of the invention is to provide a water resistance load system provided with a water resistor, which requires less labor for its transportation and installation, permits a stable resistance to be obtained and has excellent stability.

A further object of the invention is to provide a water resistance load system provided with an electrode water cooling unit, which permits recycle use without production of warm drain water and permits extreme reduction of the quantity of cooling water.

A still further object of the invention is to provide a water resistance load system provided with a water resistor having an insulation sheath with electric arc protective means effective for solving the problem of the electric arc burning accident of the insulation sheath.

A further yet object of the invention is to provide a water resistance load system provided with a water resistor with electric arc discharge prevention means effective for solving the problem of electric arc burning accident of the insulation sheath.

A yet another object of the invention is to provide a water resistance load system provided with an automatic an insulation sheath operation controlling unit for maintaining the input power to be constant by raising or lowering the an insulation sheath automatically in accordance with variations of the input power to an electrode section of the water resistor.

A further object of the invention is to provide a water resistance load system provided with an electrode water temperature controlling unit effective for maintaining the temperature of electrode water to be constant through automatic control of the capacity of an electrode water cooling unit, thereby stabilizing the resistance of electrode water used as resistor.

The above and other objects will become more apparent from the following description when the same is read with reference to the accompanying drawings.

Specifically, according to the invention there is provided a water resistance load system, which comprises a water resistor including a cylindrical base electrode with a bottom for storing a predetermined amount of circulatedly supplied water, a cylindrical main electrode penetrating an insulating support mounted in the center of the bottom of the base electrode and extending into the base electrode, a power cable of a power source device being connected to a projecting lower end of the main electrode and an insulation sheath suspended for vertical movement and covering the main electrode for controlling the exposed length of the main electrode, and an electrode water cooling unit including a radiator, warm water drained from the water resistor being introduced into and passed through the radiator before being supplied to the water resistor, a spray tube for spraying water against the radiator to cool warm water in the radiator with the latent heat of evaporation of the sprayed water, and a fan and an air guide for air cooling the surface of the radiator guiding generated steam to a space.

DESCRIPTION OF THE PREFERRED EMBODIMENT

Figure 1:
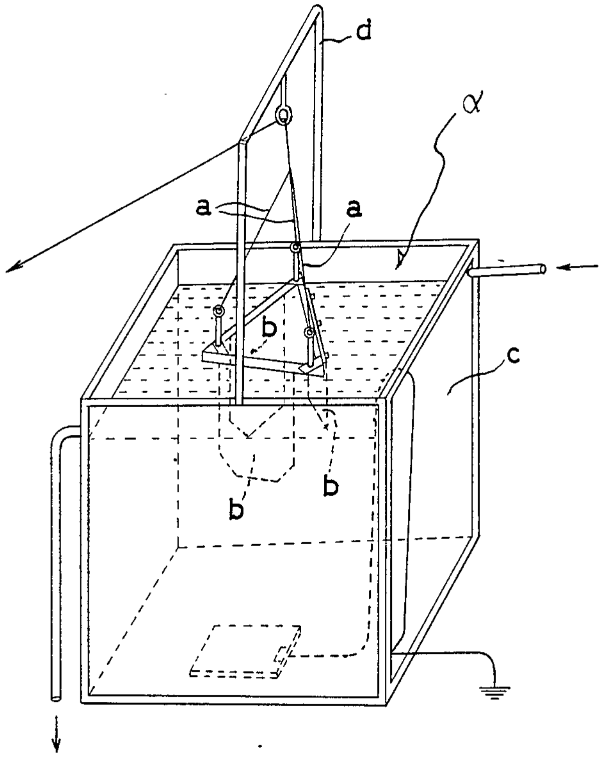
Fig.1 PRIOR ART
FIG. 1 is a perspective view showing a prior art water resistor.

A specific example of the invention will now be described with reference to FIGS. 2 to 5.

Referring to the Figures, there is shown a water resistance load system A according to the invention. The system A comprises a water resistor B. The water resistor B includes a cylindrical base electrode 22 having a bottom with a drain hole 20 for storing a predetermined quantity of water, a cylindrical main electrode 28 penetrating an insulator or like insulating support 24 secured to the center of the bottom of the base electrode 32 and extending into the base electrode 32, a power cable 26 of a power source device being connected to the lower end of the insulating support 24, and an insulation sheath 30 suspended for vertical movement to cover part of the main electrode 28 for controlling the exposed length thereof.

Figure 5:
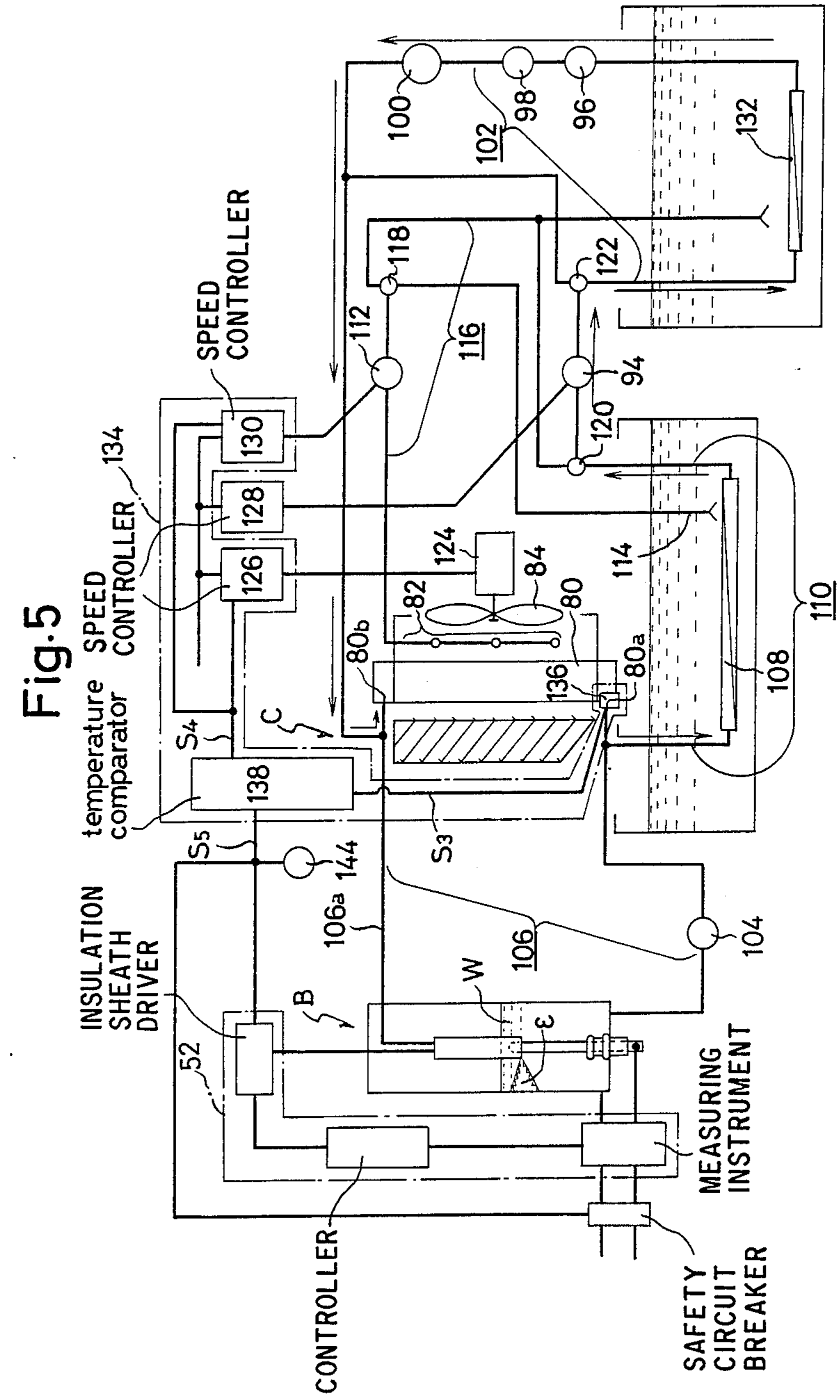
Figure 6:
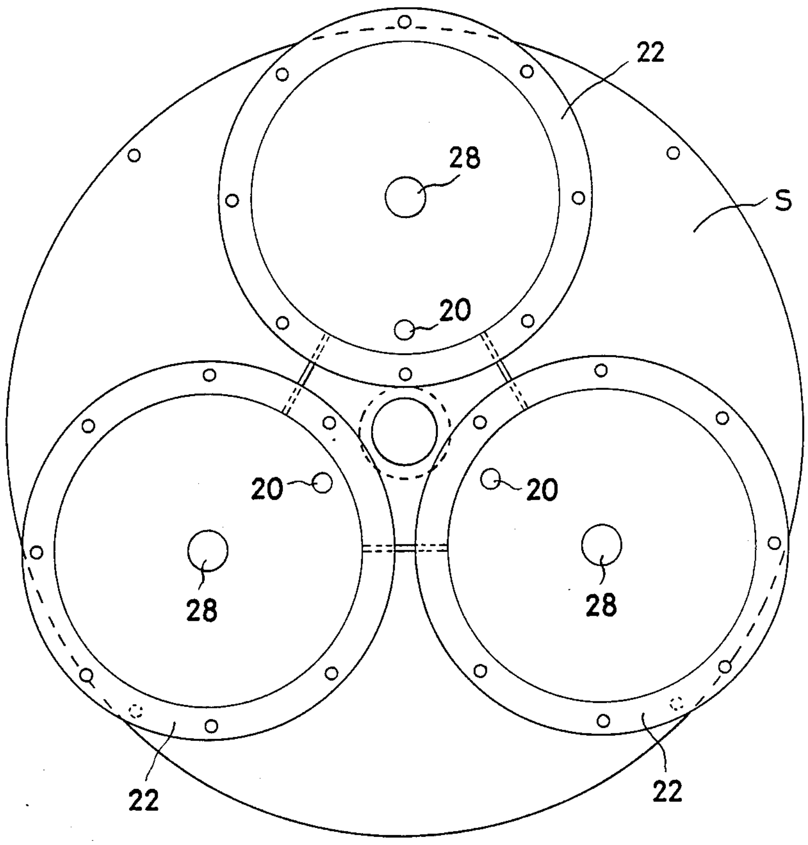
FIG. 6 is an enlarged-scale plan view showing three base electrodes provided as a set in the water resistor B.

Although only a single main electrode 28 in the water resistor B is shown in FIGS. 2 to 5, actually two or more, e.g., three in the case of FIG. 6, main electrodes are provided on a base S. In the case of FIG. 6, the three main electrodes 28 are connected to respective three phases of the power source device, while they are interconnected and grounded. Thus, a Y-connection resistor is formed.

The system shown in FIGS. 2 to 5 is a high-voltage low-current system. A low-voltage high-current system is different from this system in that the main electrode 28 has a greater diameter and defines a smaller gap with the base electrode 22.

Figure 7:
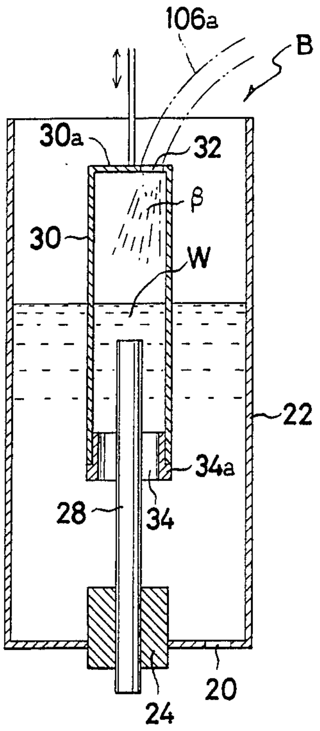
FIGS. 7 and 8 are axial sectional views showing respective examples of the water resistor.

FIG. 7 shows an example of the construction of the water resistor B. In this example, the insulation sheath 30 is made of a plastic material, e.g., polypropyrene or polyethylene tetrafluoride, having heat insulation of 100° C. or above, and its ceiling **30*a* is provided with a water supply port 32. In its lower end, a fine ceramic ring 34 is fitted, which has electric arc heat resistance. The fine ceramic ring 34 has the same outer diameter as the inner diameter of the insulation sheath 30, and it is provided at the lower end with a flange-like outer projection 34*a* having the same thickness as the thickness of the lower end of the insulation sheath 30**.

In this example, the water supply port 32 is provided in the ceiling **30*a***. However, it is possible to provide a water supply port in the peripheral wall. Further, it is possible to provide a plurality of water supply ports.

Figure 8:
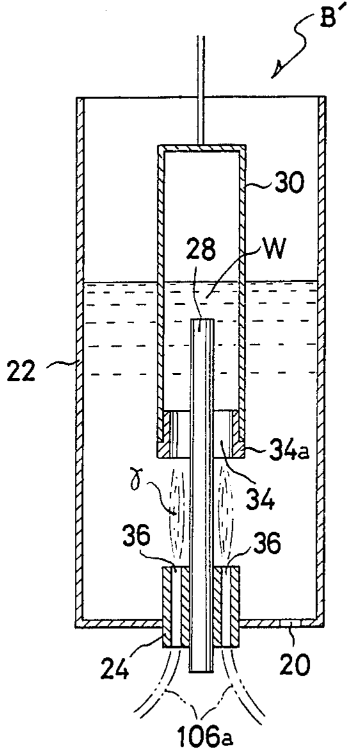

FIG. 8 shows a different example of the construction of the water resistor B'. The insulation sheath 30 is again made of a plastic material, e.g., polypropyrene or polyethylene tetrafluoride, having heat insulation of 100° C. or above. In its lower end is fitted a fine ceramic ring 34 having electric arc heat resistance. The insulating support 24 is provided with a plurality of water supply ports 36 such as to surround the main electrode 28. It is possible to provide only a single water supply port.

Figure 9:
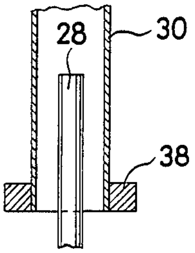
FIGS. 9 to 11 are axial sectional views, partly broken away, showing examples of insulation sheath with protective means.

FIG. 9 shows an example of the insulation sheath 30. In this example, a fine ceramic ring 38 having electric arc heat resistance is fitted as electric arc protective means on the outer periphery of the lower end of the insulation sheath 30.

Figure 10:
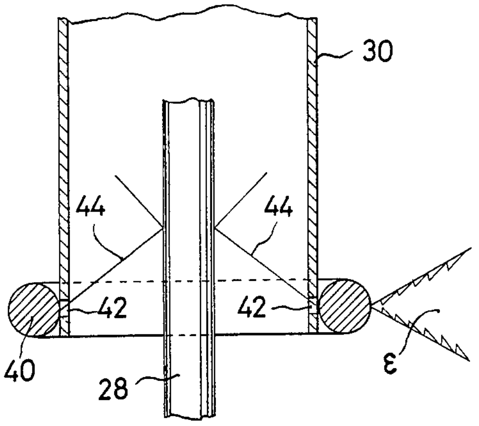

FIG. 10 shows another example of the insulation sheath 30. In this example, a metallic electric arc ring 40 is fitted as electric arc protective means on the outer periphery of the lower end of the insulation sheath 30, and also the insulation sheath 30 is formed in its portion in contact with the inner periphery of the electric arc ring 40 with a plurality of circumferentially uniformly spaced-apart see-through holes 42. Slide contacts 44 extend through the respective see-through holes 42 and extend obliquely outwardly toward the center of the insulation sheath 30. Their bent portions are in contact with the outer periphery of the main electrode 28.

Figure 11:
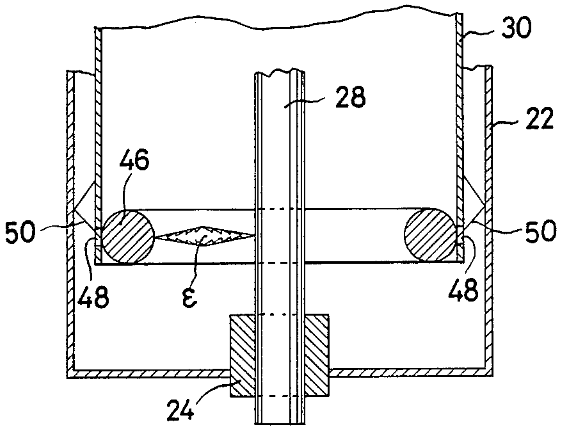

FIG. 11 shows a further example of the insulation sheath 30. In this example, a metallic arc ring 46 is fitted as electric arc protective means in the inner periphery of the lower end of the insulation sheath 30, and also the insulation sheath 30 is formed in its portion in contact with the outer periphery of the electric arc ring 46 with a plurality of circumferentially uniformly spaced-apart see-through holes 48. Slide contacts 50 extend through the respective see-through holes 48 and extend obliquely outwardly. Their bend portions are in contact with the outer periphery of the base electrode 22.

Referring back to FIG. 2, the system shown comprises an automatic insulation sheath operation controlling unit 52 for the water resistor. The unit 52 includes a measuring instrument 56 serving as a power meter or an ammeter provided between grounded cable 54 and power cable 26 for measuring power or current supplied to the cable and producing a measurement signal S1, which is either a power measurement signal or a current measurement signal, a controller 58 having a comparator for receiving the measurement signal S1 and producing a comparison value control signal S2 representing a difference or a ratio of the received signal S1 with respect to a stored reference value of power or current, and an insulation sheath driver 60 for commanding upward or downward driving of the suspended insulation sheath 30 in response to the comparison value control signal S1.

According to the invention, the controlling unit 52 may be an analog system or a digital system or a combination of analog and digital systems. In the case of the combination system, an analog/digital converter is of course inserted at a suitable intermediate position.

Figure 12:
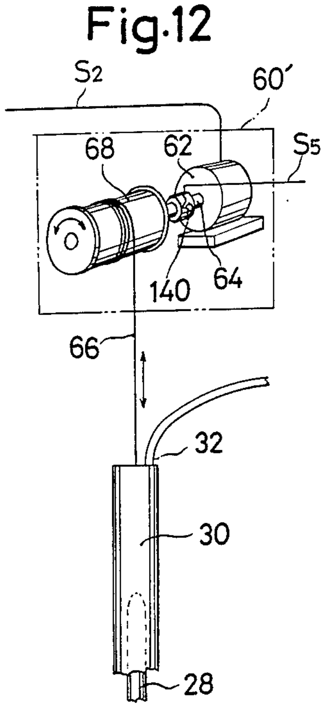
FIGS. 12 and 13 are schematic representation of respective examples of insulation sheath operation unit.

FIG. 12 shows an example of the automatic insulation sheath operation controlling unit. This operating unit 60' includes a drive motor 62 (e.g., a stepping motor, a pulse motor, etc.) to be operated for a rotational angle proportional to the difference or ratio of the comparison value control signal S2 provided from the controller 58 and a drum 68 for taking up n insulating string 66 consisting of a synthetic resin rope or a cloth rope, which is coupled to a motor shaft 64 of the drive motor 62 and suspends the insulation sheath 30.

Figure 13:
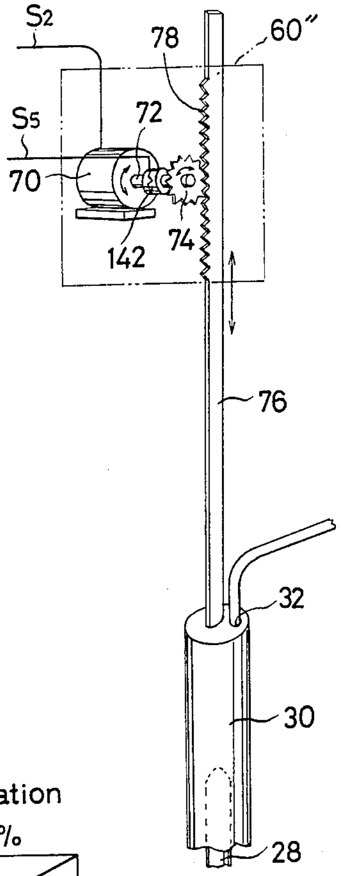

FIG. 13 shows a different example of the automatic insulation sheath driver 60". This insulation sheath driver 60" includes a drive motor 70 to be rotated by a rotational angle proportional to the difference or ratio of the comparison value control signal S2, a pinion 74 secured to an end of a motor shaft 72 of the drive motor 70 and a rack 78 in mesh with a pinion 74 formed on one side of a hanging bar 76 hanging at the lower end the insulation sheath 30.

Figure 2:
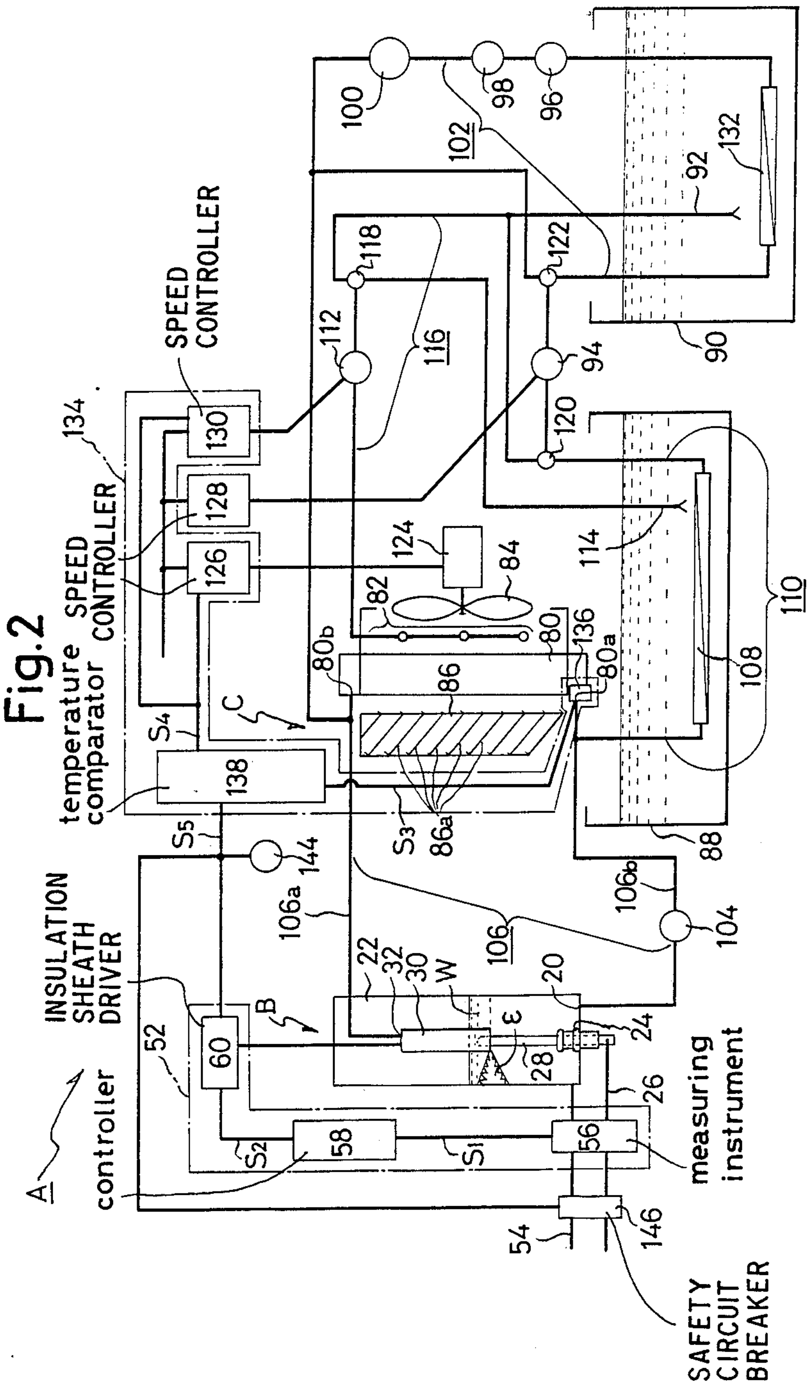
FIGS. 2 to 5 are views for explaining the operation of an embodiment of the invention, including a water resistor B and an electrode water cooling unit C connected thereto.

The system shown in FIG. 2 further comprises an electrode water cooling unit C according to the invention. This unit C serves to cool the warm water drained from the water resistor B and supply the cooled water back to the water resistor B. It includes a radiator 80, a spray tube 82 for spraying water to the back side of the radiator 80, a fan 84 for supplying cooling air from the back side of the sprays, an air guide 86 for guiding air forced out by the fan 84 through the radiator 80 to the front side thereof to the space above, a water recovery tank 88 disposed beneath the radiator 80 for recovering water having been sprayed to the radiator 80 from the spray tube 82 and falling therefrom, and an electrode water storage tank 90 for storing electrode water W to be circulated through the radiator 80. The various components noted above are interconnected by the following ductlines.

More specifically, there is a purified water supply ductline 102, in which water stored in the water storage tank 90 is pumped through a water supply pipe 92 vertically immersed in the stored water by a pump 94 and passed through filters 96 and 98 and a purifier 100 for increasing the purity of water. Also there is provided a cooling water circulation ductline 106, in which water supplied from the purified water supply ductline 102 to its inlet side is supplied to the water resistor B, and warm water drained from the water resistor B is supplied by a pump 104 to a lower water inlet **80*a* of the radiator 80. Further, there is provided a flushing/return ductline 110, in which electrode water W branched from the outlet side 106*b* of the cooling water circulation ductline 106 upstream of the water inlet 80*a* of the radiator 80 is pumped out by the pump 94 to be supplied to a cooling coil 108 for cooling and is then returned to the purified water supply ductline 102. Still further, there is provided a spray water supply ductline 116, in which water is pumped out by a spray water pump 112 through either the water supply pipe 92 vertically immersed in the water storage tank 90 or a pipe 114 vertically immersed in the water recovery tank 88 and is supplied to the spray tube 82. These ductlines are interconnected through directional control valves 118, 120 and 122**.

Reference numeral 124 in FIG. 2 designates a fan motor, 126, 128 and 130 speed controllers with inverter for the fan motor 124, pump 94 and spray water pump 112, and 132 a cooling coil.

All the above equipment including the water resistor B may be mounted on a truck or the like so that it can be transported speedily. Further, the storage tank 90 may be replaced with a pool.

The system shown in FIG. 2 further comprises an electrode water temperature controlling unit 134. The unit 134 include a temperature controller 136 provided at the lower water inlet 80 of the radiator 86 communicating with the outlet side **106*b* of the cooling water circulation ductline 106 for measuring the temperature of electrode water W flowing through the outlet 106*b* of the ductline 106 and producing a corresponding temperature measurement signal S3, a temperature comparator 138 for receiving the temperature measurement signal S3 for comparison with a preset value and producing an emergency signal S5 when a resultant control signal S4 exceeds a preset permissible high temperature range, and the speed controllers 126 and 130 with inverter controlling the driving of the motor of the spray water pump 112 and motor 124 of the fan 84, respectively, according to the control signal S4. As accessories, there are provided electromagnetic clutches 140 and 142 as shown in FIGS. 12 and 13, coupled to the respective motor shafts 64 and 72 of the insulation sheath driver 60' and 60" which are decoupled when the emergency signal S5 is received, an alarm 144 for producing an alarm when the emergency signal S5 is received, and a safety circuit breaker 146 provided on the power cable 26** for disconnecting the power source device and water resistor B from each other.

The operation of the water resistance load system A having the above construction will now be described.

Figure 3:
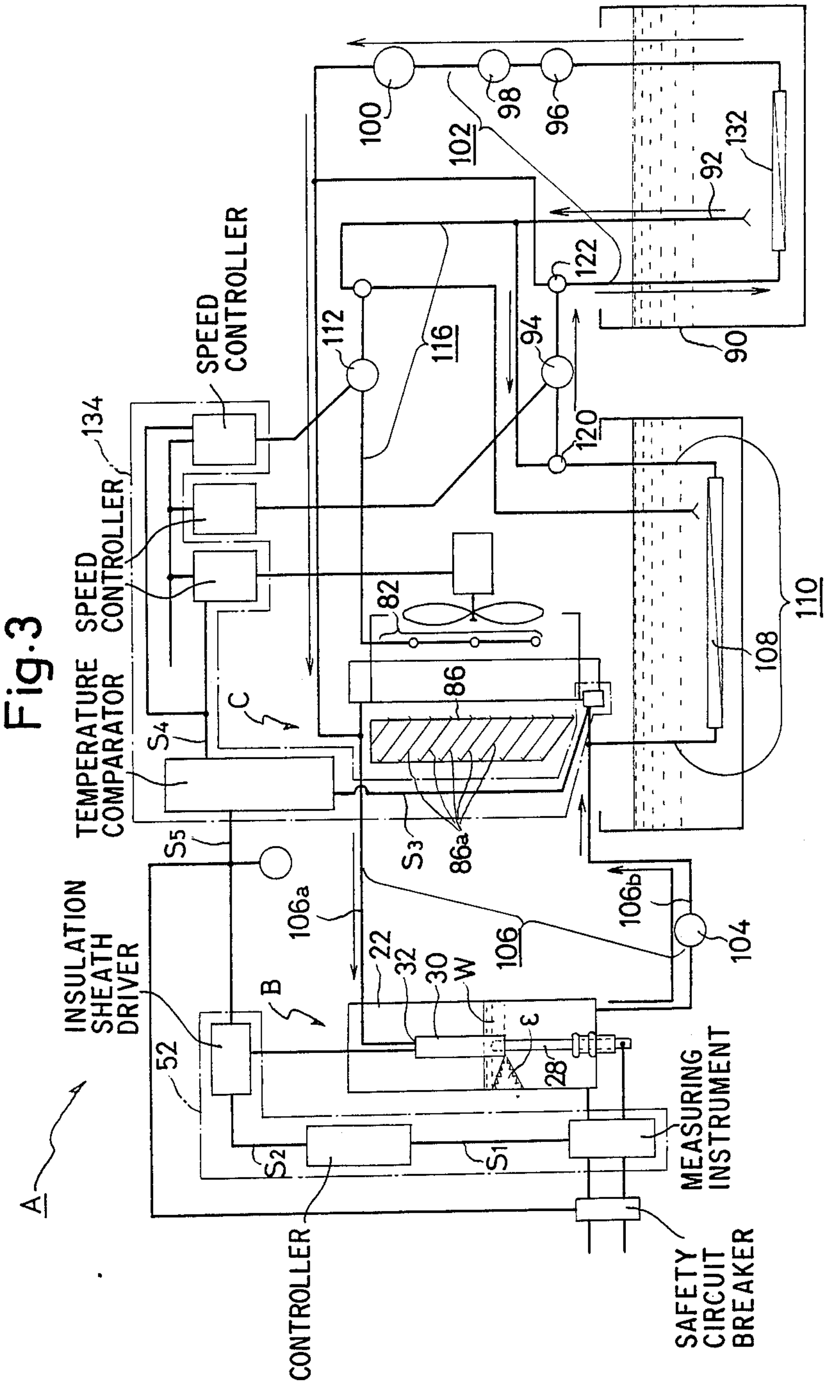
Figure 4:
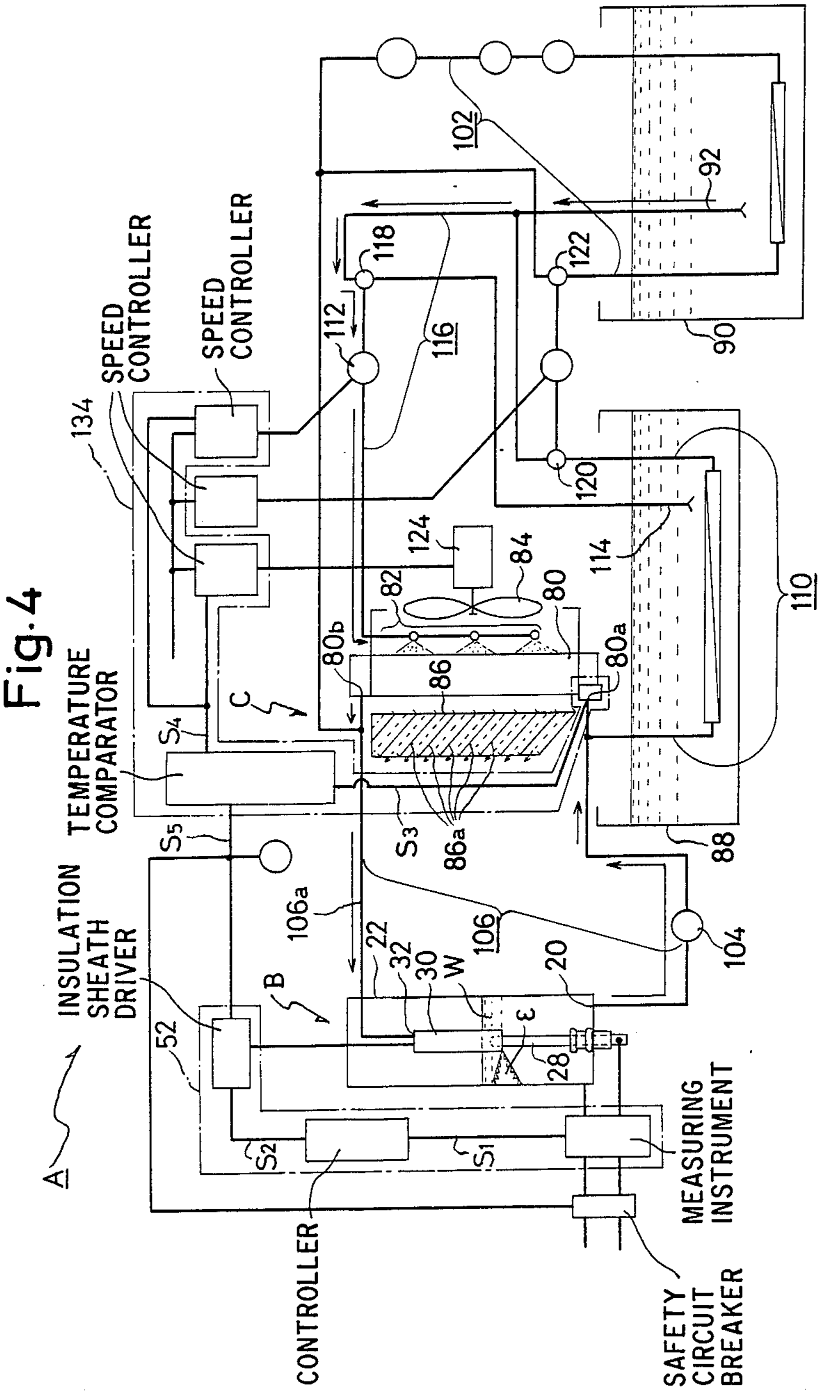

Water having been purified through the water supply pipe 92 and purified water supply ductline 102 is supplied to the inlet side **106*a* of the cooling water circulation ductline 106, as shown by arrow in FIG. 3, to fill the water resistor B. Water withdrawn from the water storage tank 90 by the pump 94 is led through the cooling coil 132 to the filter 96 for removal of sand and the like, then to the filter 98 for removal of chlorine, and then to the purifier 100. Supply water usually has an electric conductivity of about 200 $\mu$/cm. In the purifier 100, the electric conductivity is reduced to about 1 $\mu$s/cm. The water is supplied to the inlet side 106*a* of the cooling water circulation ductline 106** to be introduced into the water resistor B as shown by arrow.

In the above way, the operation of supplying electrode water W is completed. If the electric conductivity is increased due to dissolution of impurities as a result of operation of the pump 104, the water is drained, and the operation is done again from the outset.

The cooling coils 108 and 132 serve to cool water down to a temperature below 40° C., which is the maximum operating temperature of the purifier 100.

Then the purified water supply ductline 102 is closed by the directional control valves 120 and 122, and the supplied electrode water W is circulated through the cooling water circulation ductline, as shown by an arrow in FIG. 3, by operating the pump 104.

At the same time, the spray water pump 112 is operated to withdraw water from the water storage tank 92 through the water supply pipe 92 as shown by an arrow, force it through the spray water supply ductline 116 and spray it from the spray tube 82 to the radiator 80 as shown by dashed line. Further, the fan motor 124 is operated to drive the fan 84 so as to supply air to the radiator 80 from the back side thereof.

Thus, while the electrode water W passes through the water resistor B, it consumes power as a resistor and becomes warm before it is supplied to the radiator 80. As this warm water passes through the radiator 80, it is cooled down by the sprayed water. Meanwhile, the sprayed water is evaporated by robbing at the surface of the radiator 80, the heat of warm water passing through the radiator 80, and is carried along with the air blown out from the back side of the radiator 80 to be guided along guide plates 86*a* of the guide 86 provided on the front side of the radiator 80 to a space above the electrode water cooling unit C as shown by dashed arrow. The electrode water W that has been cooled down in the radiator 80 is led out from the outlet 80*b* to be supplied through the inlet 106*a* of the cooling water circulation ductline 106 to the water resistor B.

Sprayed water remaining without evaporation in the cooling of the radiator 80 is attached to the guide 86 to eventually fall by its own weight and recovered in the water recovery tank 88. When the full level of the water recovery tank 88 is approached, the directional control valve 118 is switched, so that water in the water recovery tank 88 is withdrawn through the pipe 114 by the spray water pump 112 to be supplied to the spray tube 82.

The pipe 114 and directional control valve 118 may be dispensed with by having the water recovery tank 88 and water storage tank 90 in communication with each other.

When it is desired to reduce the electric conductivity of electrode water W during operation of the system under a high voltage condition, the directional control valves 120 and 122 are switched to circulate water through the flushing/return ductline 110, purified water supply ductline 102 and cooling water circulation ductline 106, as shown by an arrow in FIG. 5. Electrode water W thus is drained from the water resistor B by the electrode water pump 104 to be forced out through the cooling coil 108 and then forced out by the pump 94 to the cooling coil 132, and then it is led through the filters 96 and 98 and purifier 100 back to the water resistor B. The electrode water W is thus deprived of foreign matter and chlorine, and its electric conductivity is reduced.

In the case of operation under low voltage and high current conditions, the electric conductivity may be increased to be above that of the supply, water, i.e., 200 μs/cm, by adding a conductive substance, e.g., salts, to the electrode water W in the water resistor B, and the resultant water may be circulated through the cooling water circulation ductline 106.

In the water resistor B, both the base electrode 22 and main electrode 28 are cylindrical and are thus subject to less potential distortion. Theoretically, this means that they are subject to less arc discharge. In addition, they are subject to less arc discharge shape-wise because they are free from local projections. Further, since the insulation sheath 30 capable of being raised and lowered is provided, it is possible to control the length of the main electrode 28 in water to control power consumption. Further, when there occurs a phenomenon of runaway with an electric arc generated due to temperature rise of water, the insulation sheath 30 may be lowered to a position to cover nearly the lowermost portion of the main electrode 28, whereby the electric arc can be quickly extinguished. That is, a function of emergency braking is provided.

Further, in the prior art water resistor inclusive of the water trough, the resistor and water trough are assembled whenever the water resistor is used. The assembly requires labor 5 to 6 persons for the water trough has a considerably large size. In contrast, the water resistor B has been assembled beforehand to have a shape as shown in FIG. 6, and it requires only two persons for installation or other handling, so that it is to obtain extreme energy saving.

Thus, compared to the prior art water resistor in which the water resistor requires many persons for assembly, the water resistor B is compact and does not require a large installation space. Further, the handling is simple, permitting energy saving. Further, since both the base electrode and main electrode are cylindrical, arc discharge is less liable to result. Further, since an insulation sheath 30 capable of being raised and lowered is provided, it is possible to obtain power consumption control and runaway emergency braking. Thus, the water resistor B has excellent safety and operability.

Further, in the electrode water cooling unit C warm water drained from the water resistor is cooled and circulated, so that there is no need of discharging warm drain water to the outside. Further, since the warm water is cooled through evaporation, there is a capacity of heat dissipation corresponding to the latent head of evaporation of water (i.e., 560 kcal/l). This capacity is approximately 11 times ($560/50 \approx 11$) of the warm water discharge system. This means that the necessary amount of water is reduced to about one-tenth even when the loss of water by scattering is taken into considerations. Further, since the flushing/return ductline 110 is provided for circulatory communication between the purified water supply ductline 102 and radiator 80 through the flushing/return ductline 110, filters 96 and 98 and purifier 100. Thus, not only the electric conductivity of water can be controlled to maintain a constant resistance, but also the scattering loss of water can be reduced by the provision of the water recovery tank 88.

During the operation of the water resistors B and B′ shown in FIGS. 7 and 8, cooled water B or circulated from the water supply port 32 or 36 through the electrode water cooling unit C and inlet side 106*a* of the cooling water circulation ductline 106 is supplied such that it directly touches the outer surface of the main electrode 28. In other words, in the case of the water resistor B, the supply water B falling from the ceiling 30*a* of the insulation sheath 30 falls into electrode water W enclosed by the insulation sheath 30, and the falling low temperature water gradually flows downwards in contact with the outer surface of the main electrode 28. Thus, the electrode water W in the insulation sheath 30 becomes lower in temperature than the electrode water W in the base electrode 30 because the cooled supply water $\beta$ is added to it at all times.

In the case of the water resistor B′, supply water $\beta$ is violently discharged upwards from the water supply ports 36 of the insulating support 24 along the main electrode 28. The supplied low temperature water thus rises in contact with the outer surface of the main electrode 28 with the violence as it is discharged. When the insulation sheath 30 is lowered, it has an effect of forcing the low temperature water into it from its lower end. Thus, the electrode water W in the insulation sheath 30 becomes lower in temperature than the electrode water W in the base electrode 22.

Consequently, the current density between the main electrode 28 and base electrode 22 is the higher as one is closer to the center. The main electrode 28 is exposed to low temperature water so that water at and near the surface is cool. Therefore, sudden increase of the surface temperature of the main electrode 28 leading to generation of air bubbles to generate electric arc discharge $\epsilon$ between the main electrode 28 and base electrode 22 as in the prior art can be prevented.

In the event if the electric arc discharge $\epsilon$ is generated, reduction of the insulation effect due to burning can be avoided for the lower end of the insulation sheath 30 is protected by the fine ceramic ring 34.

As is shown the main electrode 28 and water in the neighborhood thereof are cooled at all time by the cooled supply water $\beta$ and $\gamma$ by simple and low cost method and means, so that it is possible to avoid a grave accident of arc discharge due to insulation breakdown caused by temperature rise of the main electrode 28.

Prior to operating the automatic insulation sheath operation controlling unit 52 shown in FIG. 2, a power source device (not shown) is started to supply input power through the power cable 26 to the main electrode 28 so as to operate the water resistor B. In this case, the measuring instrument 56 as a power meter or ammeter transmits a measurement signal S1 concerning the input power or current supplied to the power cable 26 to the controller 58. As a result, a comparator (not shown) calculates the difference or ratio between a preset reference value of power or current and the measurement signal S1 to produce a control signal S2 supplied to the insulation sheath driver 60.

When the control signal S2 is supplied to the insulation sheath driver 60' shown in FIG. 12, the driver motor 62, i.e., the motor shaft 64 thereof is operated by a rotational angle corresponding to the difference or ratio represented by the control signal S2, whereby the drum 68 coupled to the motor shaft 64 is rotated in unison with the same. When the difference represented by the control signal S2 is positive and also when the ratio is unity or above, the motor shaft 64 is rotated in the clockwise direction to unwind the string 66 wound on the drum 68 so as to lower the insulation cylinder 30. Thus, the exposed length of the main electrode 28 is reduced to increase the resistance of the water resistor B. When the difference represented by the control signal S2 is negative, the motor shaft 64 is rotated in the counterclockwise direction to reduce the resistance of the water resistor B for feedback control of the input power to the power cable 26 for operating the insulation sheath driver 60' until the difference represented by the control signal S2 provided from the controller 58 becomes zero or the ratio becomes unity. In this way, the driving of the insulation sheath 30 is controlled.

In the above way, the input power supplied from the power source device is held to be a constant desired value of the controller 58.

When the insulation sheath driver 60" receives the control signal S2, the motor shaft 72 of the drive motor 70 is rotated by a rotational angle corresponding to the difference or ratio represented by the control signal S2, thus rotating the pinion 74 integral with the motor shaft 72. When the pinion 74 is rotated counterclockwise, the having bar 76 is lowered. When the pinion 74 is rotated in the counterclockwise direction, the hanging bar 76 is raised.

Thus, the relation between the direction of rotation of the motor shaft 72 and the vertical movement of the insulation sheath 30 is the same as in the case of the insulation sheath driver 60' as shown in FIG. 12.

Thus, when the input power to the electrode section is varied, the insulation sheath is automatically raised or lowered to an extent corresponding to the variation, thus effecting the control of the exposed length of the main electrode. Thus, it is possible to dispense with the monitoring personnel, and overnight continuous operation is possible. Further, since variations can be speedily followed, the generation of electric arc discharge due to the insulation breakdown can be eliminated, thus improving the safety and reliability.

Prior to the operation of the electrode water temperature controlling unit 134 shown in FIG. 2, a power source device (not shown) is started, whereby input power is supplied through the power cable 26 to the main electrode 28, and also the water resistor B is operated to start the pump 104 and circulate electrode water W from the outlet side **106*b* of the cooling water circulation ductline 106 through the radiator 80 to the supply side 106*a*** of the ductline.

Figure 14:
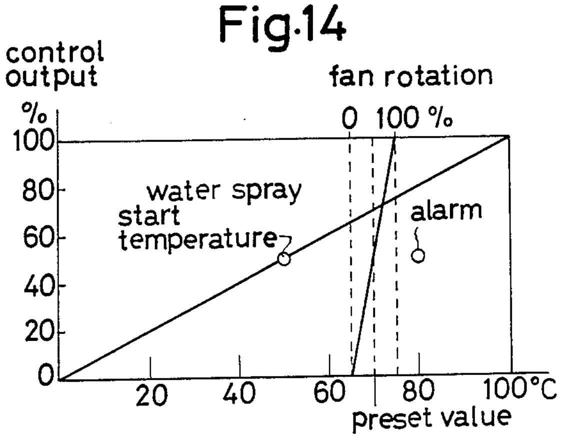
FIG. 14 is a graph showing the correlation characteristics of electrode water temperature and control output in the operation of an electrode water temperature control system.

A proportional zone control operation of the fan 84 as shown in FIG. 14 is as follows. When electrode water W elevated in temperature in the base electrode 22 is passed through the drain port 20 and also through the outlet side **106*b* of the cooling water circulation ductline 106 to the lower water inlet 80*a* of the radiator 80, the water temperature sensor 136 detects the water temperature and transmits a measurement signal S4 to the temperature comparator 138. The temperature comparator 138 takes a difference or ratio between the input measurement signal S3 and a preset measurement value and transmits a control signal S4 representing the difference or ratio to the speed controller 126. The speed controller 126 causes an AC current proportional to the control signal S4 to control the rotational speed of the motor 124 for rotating the fan 84**.

The fan 84 is designed such that the control signal S4 represents zero speed at $-5°$ C. and full speed at $+5°$ C. In the temperature range between these two limits the quantity of air supplied is controlled through the proportional control to control the cooling capacity, thus holding a constant temperature of the electrode water W.

In a water spray control operation of the spray tube 82, as in the case of the fan 84, the control signal S4 provided from the temperature controller 138 is transmitted to the speed controller 130. The speed controller 130 causes an AC current proportional to the control signal S4 to control the rotational speed of the motor (not shown) of the spray water pump 112, thus driving the spray water pump 112 to control the quantity of water supplied to control the quantity of water sprayed from the water spray tube 82 through the spray water supply ductline 116.

The water spray tube 82 starts water spray when the control signal S4 represents a value of $70-50=20$ where 70° C. is a preset value and 50° C. is a water spray start temperature, and the quantity of the sprayed water is increased with temperature increase. The water spray is stopped at a temperature below a predetermined temperature, e.g., 50° C. corresponding to the value of 20 represented by the signal S4, thus preventing overcooling and saving the amount of water.

The operation of the accessories is as follows. When a preset upper limit temperature, e.g., 80° C., is exceeded so that the difference represented by the signal S3 from the sensor 136 becomes zero or negative or the radio becomes less than unity in the temperature comparator 118, an emergency signal S5 is transmitted to the alarm 144, e.g., a buzzer or a bell, safety circuit breaker 146, e.g., a fuse, inserted in the power cable 26 between the water resistor B and power source device (not shown) and electromagnetic clutches 140 and 142 of the insulation sheath driver 60' and 60". Thus, the alarm 144 is operated to let the operation monitoring personnel know the temperature rise, the safety circuit breaker 146 is disconnected to stop the operation of the water resistor B, and the electromagnetic clutches 140 and 142 to render the drum 68 and pinion 74 to be an idling state and thus case the insulation sheath 30 to fall quickly due to the own weight, thus concealing the main electrode 28 to stop or prevent generation of an electric arc discharge.

As has been shown, the electrode water temperature of the water resistor is instantaneously detected by the temperature sensor to control the air supply capacity of the fan and spray capacity of the spray tube through the temperature comparator so as to automatically control the temperature of the water electrode. Thus, there is no need of manual control of speed controllers by the monitoring personnel every time the electrode water temperature is measured. It is thus possible to obtain overnight continuous operation. Further, water temperature variations can be quickly followed, thus reducing the generation of electric arc discharge due to insulation breakdown and improving the safety and reliability. Besides, it is possible to obtain very stable measurement or testing of the output characteristics of various power source devices with the water resistor and ensure high fidelity, high accuracy and high reliability.

Moreover, in the event if electric arc discharge $\epsilon$ is generated in the water resistor, reduction of the insulation effect due to burning can be avoided because the lower end of the insulation sheath 30 is protected by the fine ceramic ring 38 or 34. Further, in the case of the arrangement of FIG. 10, the arc ring 40 is fitted on the lower end of the insulation sheath 30, and the arc ring 40 and main electrode 28 are held at the same potential via the slide contacts 44. Thus, the electric arc discharge $\epsilon$ is generated between the arc ring 40 and base electrode 22, so that the arc $\epsilon$ neither proceeds past or touches the lower end of the insulation sheath 30.

In the case of the arrangement of FIG. 11, the arc ring 46 is fitted in the lower end of the insulation sheath 30, and the arc ring 46 and base electrode 22 are held at the same potential via the slide contacts 50. Thus, electric arc discharge $\epsilon$ is generated between the arc ring 46 and main electrode 28, and the arc $\epsilon$ neither proceeds past or touches the lower end of the insulation sheath 30.

Furthermore, since the lower end of the insulation sheath 30 is provided with the arc protective means, even if the electric arc discharge $\epsilon$ is generated, the lower end of the insulation sheath 30 is never burnt, thus leading to no reduction of insulation in the subsequent use. High durability thus can be ensured, cumbersome operation of the insulation sheath 30 thus is greatly reduced, and the maintenance and inspection can be facilitated. In effect, the safety and reliability can be increased. Further, it is possible to obtain an excellent effect of avoiding a grave accident due to insulation breakdown of the water resistor.

According to the invention, the water resistor load of a power source device is used as, but it can also be used alone as a main resistor of an induction motor.

What is claimed is:

1. A water resistance load apparatus for measurement or testing of the output characteristics of electric power sources comprising a hollow cylindrical base electrode having an axis which is vertically disposed, said cylindrical base electrode having a closed bottom such that said hollow cylindrical base electrode is capable of containing water, insulation support means in said closed bottom, a cylindrical main electrode passing through said insulation support means and extending up into said hollow cylindrical base electrode, a power cable means connected to said cylindrical main electrode and said cylindrical base electrode, said cylindrical base electrode being radially spaced form said cylindrical main electrode by an annular space, an insulation sheath disposed in said annular space, control means for vertically moving said insulation sheath and operable to maintain the output power from said electric power source at a substantially constant desired value vertically moving said insulation sheath, cooling means for cooling said water, and circulation means for circulating said water between said cooling means and said hollow cylindrical base electrode.

2. A water resistance load apparatus according to claim 1, wherein said cooling means comprises heat exchange means, said circulating means having a first conduit means to feed warmed water from said base electrode means to said heat exchanger means and second conduit means to feed cooled water from said heat exchange means to said base electrode means, said heat exchanger means comprising a radiator means and spray means for spraying a cooling medium onto said radiator means for cooling the water in said radiator means, whereby water which is heated in said cylindrical base electrode is recirculated through and cooled by said radiator means.

3. A water resistance load apparatus according to claim 1 comprising a plurality of said base electrodes and said main electrode along with a plurality of said insulation sheaths, said water resistance load apparatus being operable with a multi-phase power source, The number of said plurality corresponding to the number of phases in said multi-phase source.

4. A water resistance load apparatus according to claim 2, wherein said insulation sheath is a hollow cylinder having a closed top, said closed top having opening means through which said water is fed from said first conduit means to the inside of said hollow cylindrical insulation sheath.

5. A water resistance load apparatus according to claim 2, wherein said insulation support means has passage means through which said water is fed from said first conduit means to said base electrode.

6. A water resistance load apparatus according to claim 1, wherein said insulation sheath has a lower end, and electric arc protection means on said lower end.

7. A water resistance load apparatus according to claim 6, wherein said electric arc protection means comprises a ceramic ring mounted on said insulation sheath.

8. A water resistance load apparatus according to claim 1, wherein said insulation sheath has a lower end, and further comprising a conductive arc ring disposed on said lower end of said insulation sheath, and slide contact means extending inwardly from said conductive arc ring and in contact with said main electrode.

9. A water resistance load apparatus according to claim 1, wherein said insulation sheath has a lower end, and further comprising a conductive arc ring disposed on said lower end of said insulation sheath, and slide contact means extending outwardly from said conductive arc ring and in contact with said base electrode.

10. A water resistance load apparatus according to claim 1, wherein said insulation sheath is made of a hat-resistant plastic material selected from the group consisting of polypropyrene and tetrafluoropolyethylene.

11. A water resistance load apparatus according to claim 1, wherein said circulating means further comprises a filter and a water purifier for filtering and purifying water circulated to said base electrode.

12. A water resistance load apparatus according to claim 2, wherein said heat exchange means further comprises a fan for blowing air onto one side of said radiator means and an air guide means on the opposite side of said radiator means for guiding the air after the air has passed by said radiator means, said heat exchanger means further comprising a cooling medium recovery tank underlying said air guide means for recovering said sprayed cooled medium which has been sprayed onto said radiator means by said spray means and which has not evaporated.

13. A water resistance load apparatus according to claim 12, wherein said heat exchange means further comprises a storage tank for receiving said cooling medium from said recovery tank, said spray means having a conduit extending to said storage tank for conducting said cooling medium from said storage tank to said spray means.

14. A water resistance load apparatus according to claim 1, wherein said control means comprises a measuring instrument for providing a measurement signal representing one of the measured power and current supplied through said power cable means, a controller for receiving said measurement signal and providing a control signal obtained by comparing said measurement signal with a reference value, and an automatic insulation sheath operation controlling unit for moving said insulation sheath up and down according to said control signal.

15. A water resistance load apparatus according to claim 14, wherein said measuring instrument is selected from the group consisting of a power meter and an ammeter.

16. A water resistance load apparatus according to claim 14, wherein said controlling unit comprises a drive motor rotated in proportion to the input of said control signal, said motor having a shaft, a drum coupled to said shaft of said drive motor, and an elongated suspension element connected to said insulation sheath, said element being wound on said drum.

17. A water resistance load apparatus according to claim 14, wherein said controlling unit comprises a drive motor rotated in proportion to the input of said control signal, said motor having a shaft, a pinion secured to said shaft of said drive motor, and a rack means meshing with said opinion, said rack means being connected to said insulation sheath.

18. A water resistance load apparatus according to claim 12, wherein said cooling means comprises an electrode water temperature controlling unit having a temperature sensor for producing a measurement signal upon measuring the temperature of said water flowing through said second conduit means, a temperature comparator for receiving said measurement signal and providing a control signal upon comparing the received measurement signal with a reference value, and a controller for controlling the operation of said fan according to said control signal.

19. A water resistance load apparatus according to claim 1, wherein said cooling means comprises an electrode water temperature controlling unit having a temperature sensor for producing a measurement signal by measuring the temperature of said water flowing through said second conduit means, a temperature comparator for receiving said measurement signal and providing a control signal and providing a control signal upon comparing the received measurement signal with a reference value, and a controller for controlling the operation of said fan and said spray means.

20. A water resistance load apparatus for measurement or testing of the output characteristics of electric power source comprising a hollow cylindrical base electrode having an axis which is vertically disposed, said cylindrical base electrode having a closed bottom such that said hollow cylindrical base electrode is capable of containing water, insulation support means in said closed bottom, a cylindrical main electrode passing through said insulation support means and extending up into said hollow cylindrical base electrode, a power cable means connected to said cylindrical main electrode and said cylindrical base electrode, said cylindrical base electrode being radially spaced form said cylindrical main electrode by an annular space, an insulation sheath disposed in said annular space, control means for vertically moving said insulation sheath between different vertical positions in which said insulation sheath is disposed between said cylindrical base electrode and said cylindrical main electrode, said control means comprising a measuring instrument for providing a measurement signal representing one of the measured power and current supplied through said power cable means, a controller for receiving said measurement signal and providing a control signal obtained by comparing said measurement signal with a reference value, an automatic insulation sheath operation controlling unit for moving said insulation sheath up and down according to said water, an circulation mean for circulating said water between said cooling means and said hollow cylindrical base electrode, said circulating means having a first conduit means to feed warmed water from said base electrode means to said cooling means and second conduit means to feed cooled water from said cooling means to said base electrode means whereby water which is heated in said cylindrical base electrode is recirculated through and cooled by said cooling means.

* * * * *

UNITED STATES PATENT OFFICE
CERTIFICATE OF CORRECTION

Patent No. 4,853,621 Dated August 1, 1989

Inventor(s) Kesafumi MATSUMOTO

It is certified that error appears in the above-identified patent and that said Letters Patent is hereby corrected as shown below:

Claim 4, line 4, change "first" to --second--.

Claim 5, line 4, change "first" to --second--.

Claim 10, line 3, change "hat-resistant" to --heat-resistant--.

Claim 17, line 6, change "opinion" to --pinion--.

Claim 18, line 6, change "second" to --first--.

Claim 19, line 2, change "1" to --12--;

line 6, change "second" to --first--.

Signed and Sealed this

Sixth Day of November, 1990

*Attest:*

HARRY F. MANBECK, JR.

*Attesting Officer* *Commissioner of Patents and Trademarks*